(12) United States Patent
Lee

(10) Patent No.: US 8,937,833 B2
(45) Date of Patent: Jan. 20, 2015

(54) SEMICONDUCTOR MEMORY DEVICE INCLUDING MEMORY CELLS AND A PERIPHERAL CIRCUIT AND METHOD OF OPERATING THE SAME

(71) Applicants: SK Hynix Inc., Icheon (KR); SNU R&DB Foundation, Seoul (KR)

(72) Inventor: Jong Ho Lee, Seoul (KR)

(73) Assignees: SK Hynix Inc., Icheon (KR); SNU R&DB Foundation, Seoul (KR)

( * ) Notice: Subject to any disclaimer, the term of this patent is extended or adjusted under 35 U.S.C. 154(b) by 133 days.

(21) Appl. No.: 13/750,935

(22) Filed: Jan. 25, 2013

(65) Prior Publication Data

US 2013/0194870 A1    Aug. 1, 2013

(30) Foreign Application Priority Data

Jan. 30, 2012    (KR) .......................... 10-2012-0009076

(51) Int. Cl.
*G11C 16/04*    (2006.01)
*G11C 16/26*    (2006.01)
*G11C 16/02*    (2006.01)

(52) U.S. Cl.
CPC ................ *G11C 16/26* (2013.01); *G11C 16/02* (2013.01); *G11C 16/0483* (2013.01)
USPC ............ 365/185.02; 365/185.17; 365/185.18; 365/185.21

(58) Field of Classification Search
CPC ........................ G11G 16/0483; G11G 16/3418
USPC ............... 365/185.02, 185.17, 185.18, 185.21
See application file for complete search history.

(56) References Cited

U.S. PATENT DOCUMENTS

| | | | |
|---|---|---|---|
| 2007/0153573 A1* | 7/2007 | Fong et al. ................ | 365/185.02 |
| 2009/0052257 A1* | 2/2009 | Park et al. ................ | 365/185.23 |
| 2009/0135656 A1* | 5/2009 | Park ........................ | 365/185.19 |
| 2011/0317489 A1* | 12/2011 | Kim et al. ................ | 365/185.18 |
| 2012/0069680 A1* | 3/2012 | Goda et al. ............... | 365/185.23 |
| 2012/0147676 A1* | 6/2012 | Mokhlesi et al. ........ | 365/185.17 |

FOREIGN PATENT DOCUMENTS

| | | |
|---|---|---|
| KR | 10-0811278 B1 | 2/2008 |
| KR | 10-2009-0036974 A | 4/2009 |
| KR | 10-2009-0036976 A | 4/2009 |
| KR | 10-2011-0078731 A | 7/2011 |
| KR | 10-2011-0120467 A | 11/2011 |

\* cited by examiner

*Primary Examiner* — Hoai V Ho

(57) ABSTRACT

A semiconductor memory device includes a memory block including memory strings coupled to and disposed between bit lines and a common source line, and a peripheral circuit configured to perform a read operation of memory cells included in selected memory strings of the memory strings and increase channel potential of unselected memory strings in the read operation.

20 Claims, 10 Drawing Sheets

SEMICONDUCTOR MEMORY DEVICE INCLUDING MEMORY CELLS AND A PERIPHERAL CIRCUIT AND METHOD OF OPERATING THE SAME

CROSS-REFERENCE TO RELATED APPLICATION

This application claims priority from Korean Patent Application No. 10-2012-0009076, filed on Jan. 30, 2012, the contents of which are incorporated herein by reference in their entirety.

BACKGROUND

Embodiments of the present invention relate to a semiconductor memory device including a plurality of memory cells and a method of operating the same.

As the degree of integration of a semiconductor memory device increases, memory cell size decreases and space between memory cells narrows. As a result, cell current reduces and operational characteristics of the semiconductor memory device deteriorate.

Accordingly, a method of enhancing the operational characteristics of the semiconductor memory device has been required.

SUMMARY OF THE INVENTION

Embodiments of the present invention are directed to a semiconductor memory device having enhanced operational characteristics and a method of operating the same.

In accordance with an embodiment of the present invention, a semiconductor memory device includes a memory block configured to include memory strings coupled to and disposed between bit lines and a common source line; and a peripheral circuit configured to perform a read operation of memory cells included in selected memory strings of the memory strings, and increase channel potential of memory strings not selected in the read operation.

In accordance with another embodiment of the present invention, a method of operating a semiconductor memory device includes supplying a source voltage to a common source line coupled in common to source select transistors of memory strings, and supplying a precharge voltage to bit lines not selected of bit lines coupled to drain select transistors of the memory strings; supplying a pass voltage to memory cells not selected of memory cells coupled between the source select transistor and the drain select transistor; supplying a read voltage to memory cell selected from the memory cells; and sensing voltage or current of bit lines selected from the bit lines.

A semiconductor memory device of the present invention may have enhanced operational characteristics.

BRIEF DESCRIPTION OF THE DRAWINGS

The above and other features and advantages of the present invention will become readily apparent by reference to the following detailed description when considered in conjunction with the accompanying drawings wherein.

DETAILED DESCRIPTION

Hereinafter, preferred embodiments of the present invention will be explained in more detail with reference to the accompanying drawings. Although the present invention has been described with reference to a number of illustrative embodiments thereof, it should be understood that numerous other modifications and embodiments can be devised by those skilled in the art that will fall within the spirit and scope of the principles of this disclosure.

Figure 1:
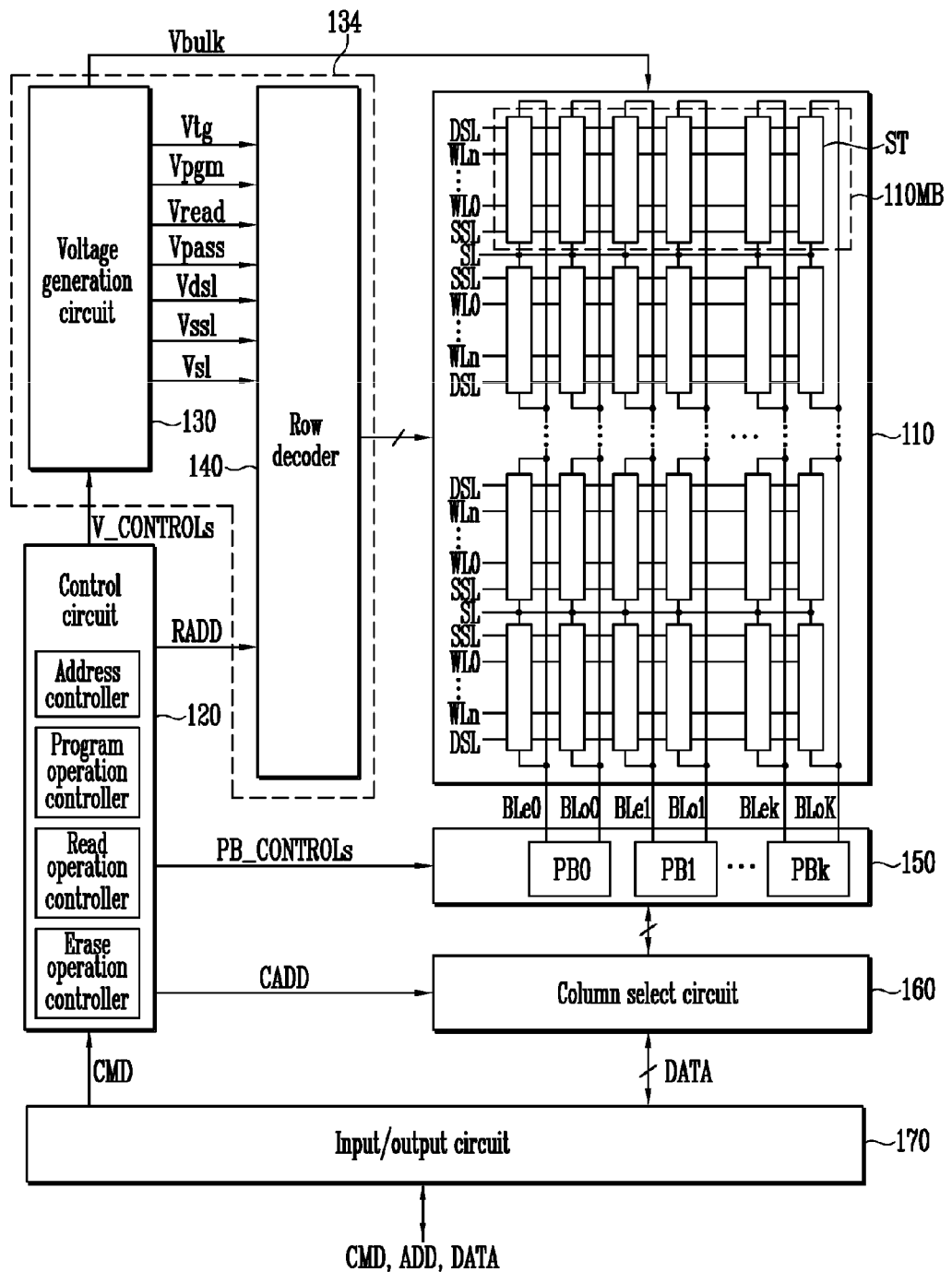
FIG. 1 illustrates a semiconductor memory device according to an embodiment of the present invention.
Figure 2:
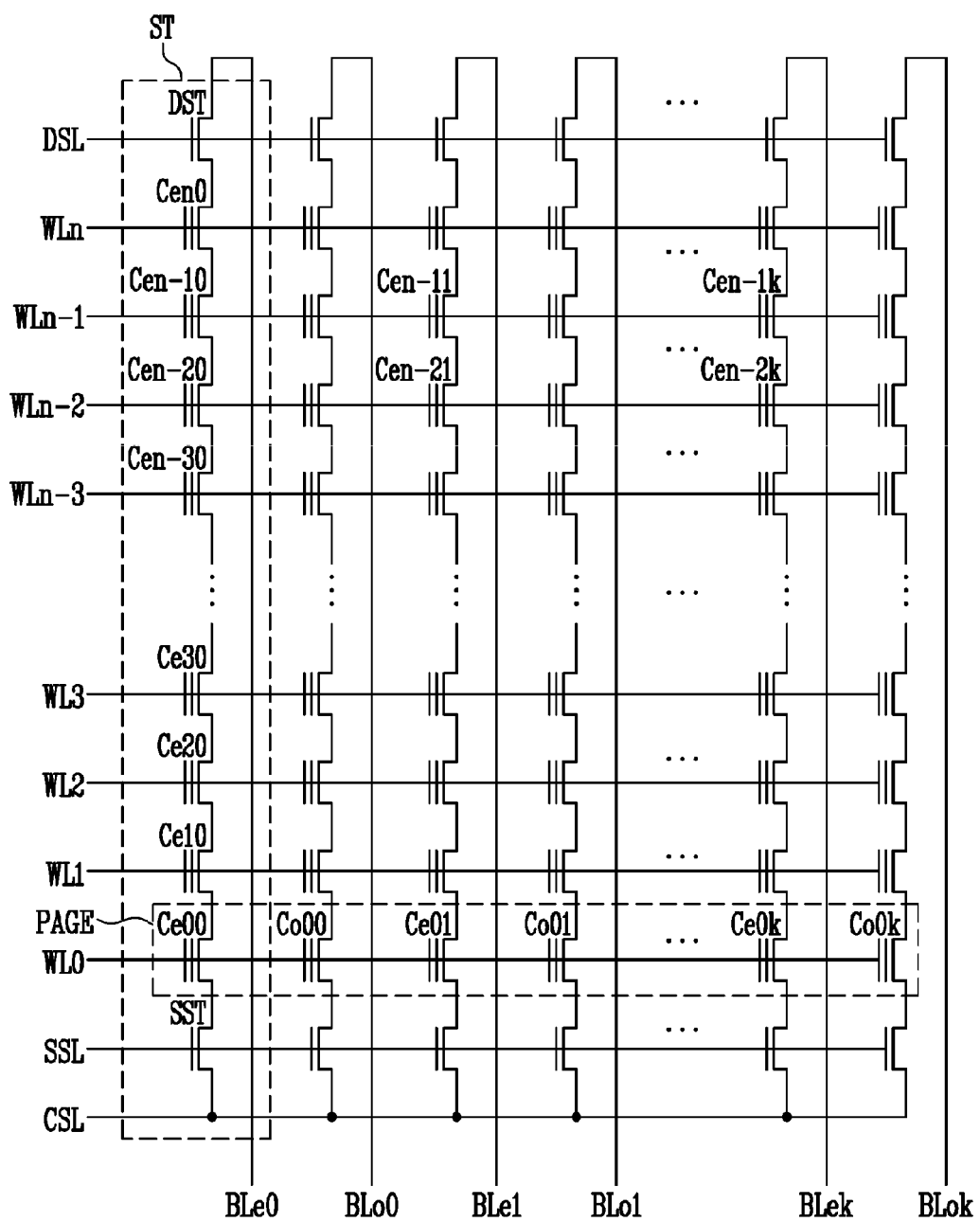
FIG. 2 illustrates a memory block of FIG. 1.

FIG. 1 illustrates a semiconductor memory device according to an embodiment of the present invention. FIG. 2 illustrates a memory block of FIG. 1.

Referring to FIG. 1, the semiconductor memory device includes a memory array 110 and a peripheral circuit 120 to 170.

The memory array 110 includes a plurality of memory blocks 110 MB. Each of the memory blocks 110 MB may have the same structure. Hereinafter, the structure of the memory block 110 MB will be described in detail with reference to FIG. 2.

Referring to FIG. 2, each of the memory blocks may include a plurality of memory strings ST coupled to and disposed between bit lines BLe0~BLek and BLo0~BLok and a common source line SL. That is, the memory strings ST are respectively coupled to the bit lines BLe0~BLek and BLo0~BLok and are coupled in common to the common source line SL. Each of the memory strings ST may include a source select transistor SST, a cell string where memory cells Ce00~Cen0, n being a positive integer, are coupled in series, and a drain select transistor DST. A source of the source select transistor SST is coupled to the common source line SL, and a drain of the drain select transistor DST is coupled to a bit line, e.g., BLe0. The memory cells Ce00~Cen0 are coupled in series to each other and disposed between the select transistors SST and DST. A gate of the source select transistor SST is coupled to a source select line SSL, gates of the memory cells Ce00~Cen0 are respectively coupled to word lines WL0~WLn, and a gate of the drain select transistor DST is coupled to a drain select line DSL.

Here, the drain select transistor DST couples the cell string Ce00~Cen0 to a corresponding bit line. The source select transistor SST couples the memory cells Ce00~Cen0 to the common source line SL.

Memory cells in a memory cell block of a NAND flash memory device may be divided into a physical page or a logical page. For example, in FIG. 2, memory cells Ce00~Ce0k and Co00~Co0k coupled to one word line, e.g., WL0, may form one physical page, k being a positive integer. Even-numbered memory cells Ce00~Ce0k coupled to one word line, e.g., WL0, may form one even physical page, and odd-numbered memory cells Co00~Co0k may form one odd physical page. The even or odd physical page is a reference unit for a program operation or a read operation.

Referring to FIG. 1 and FIG. 2, the peripheral circuit 120~170 performs an erase loop, a program loop, and a read operation on the memory cells Ce00~Ce0k or Co00~Co0k coupled to a selected word line, e.g., WL0. Hereinafter, the erase loop, the program loop, and the read operation will be described in detail.

Erase Loop

The erase loop includes an erase operation and an erase verify operation. In the erase operation, the peripheral circuit 120~170 floats the select lines DSL and SSL, supplies an erase allowable voltage, e.g., 0V, to word lines WL0~WLn of a selected memory block, and supplies an erase voltage Vbulk to a bulk, e.g., a substrate or P-well of the selected memory block. The erase verify operation is performed to verify whether or not threshold voltages of memory cells in the selected memory block receive a voltage level lower than a target erase level after the erase operation is completed.

In the erase verify operation, the peripheral circuit 120~170 precharges the bit lines BLe0~BLek or BL0~BLok, supplies select voltages Vdsl and Vssl to the select lines DSL and SSL to turn on the select transistors DST and SST, supplies a ground voltage to the common source line SL, and supplies a verify voltage Vtg having the target erase level to the word lines WL0~WLn. Subsequently, the peripheral circuit 120~170 senses a voltage change in the bit lines BLe0~BLek or BL0~BLok. The erase loop is finished when it is sensed that the bit lines BLe0~BLek or BL0~BLok are discharged. The erase operation and the erase verify operation are performed again when at least one undischarged bit line is detected. In this case, the peripheral circuit 120~170 may increase a level of the erase voltage Vbulk.

Program Loop

The program loop includes a program operation and a program verify operation. In the program operation, the peripheral circuit 120~170 supplies a program allowable voltage, e.g., 0V, to a selected bit line coupled to a memory string including a program allowable cell, and supplies a program inhibition voltage, e.g., Vcc, to a bit line coupled to an unselected memory string including a program inhibition cell. The peripheral circuit 120~170 may supply the drain select voltage Vdsl for turning on the drain select transistor DST to the drain select line DSL, supply the source select voltage Vssl for turning off the source select transistor SST to the source select line SSL, and supply a supply voltage to the common source line SL. The peripheral circuit 120~170 supplies a program voltage Vpgm to a selected word line, and supplies a pass voltage Vpass to unselected word lines. As a result, a threshold voltage of the program allowable cell increases.

In the program verify operation, the peripheral circuit 120~170 precharges the bit lines BLe0~BLek or BL0~BLok, supplies the select voltages Vdsl and Vssl to the select lines DSL and SSL, respectively, to turn on the select transistors DST and SST, supplies a ground voltage to the common source line SL, and supplies a verify voltage Vtg having a target program level to the word lines WL0~WLn. Then, the peripheral circuit 120~170 senses a voltage change in the bit lines BLe0~BLek or BL0~BLok. The program loop is finished when the selected bit lines maintain a precharge state. The program operation and the program verify operation are performed again when at least one discharged bit line is detected from the selected bit lines. In this case, the peripheral circuit 120~170 may increase a level of the program voltage Vpgm.

Read Operation

In the event that a read operation for the even physical page is performed, even bit lines BLe0~BLek coupled to even memory cells in the even physical page are selected while odd bit lines BL0~BLok coupled to odd memory cells in the odd physical page are not selected.

The peripheral circuit 120~170 precharges the selected bit lines BLe0~BLek, supplies the select voltages Vdsl and Vssl to the select lines DSL and SSL, respectively, to turn on the select transistors DST and SST, and supplies a ground voltage to the common source line SL. The peripheral circuit 120~170 supplies a read voltage Vread to the selected word line, and supplies the pass voltage Vpass to the unselected word lines. It is desirable that the pass voltage Vpass is supplied with a level for turning on every memory cell irrespective of a program level of the memory cells and has a voltage level lower than that of the pass voltage Vpass in the program operation. Subsequently, the peripheral circuit 120~170 senses a voltage change in the selected bit lines BLe0~BLek, and latches data stored in selected memory cells according to the sensing result.

Figure 4:
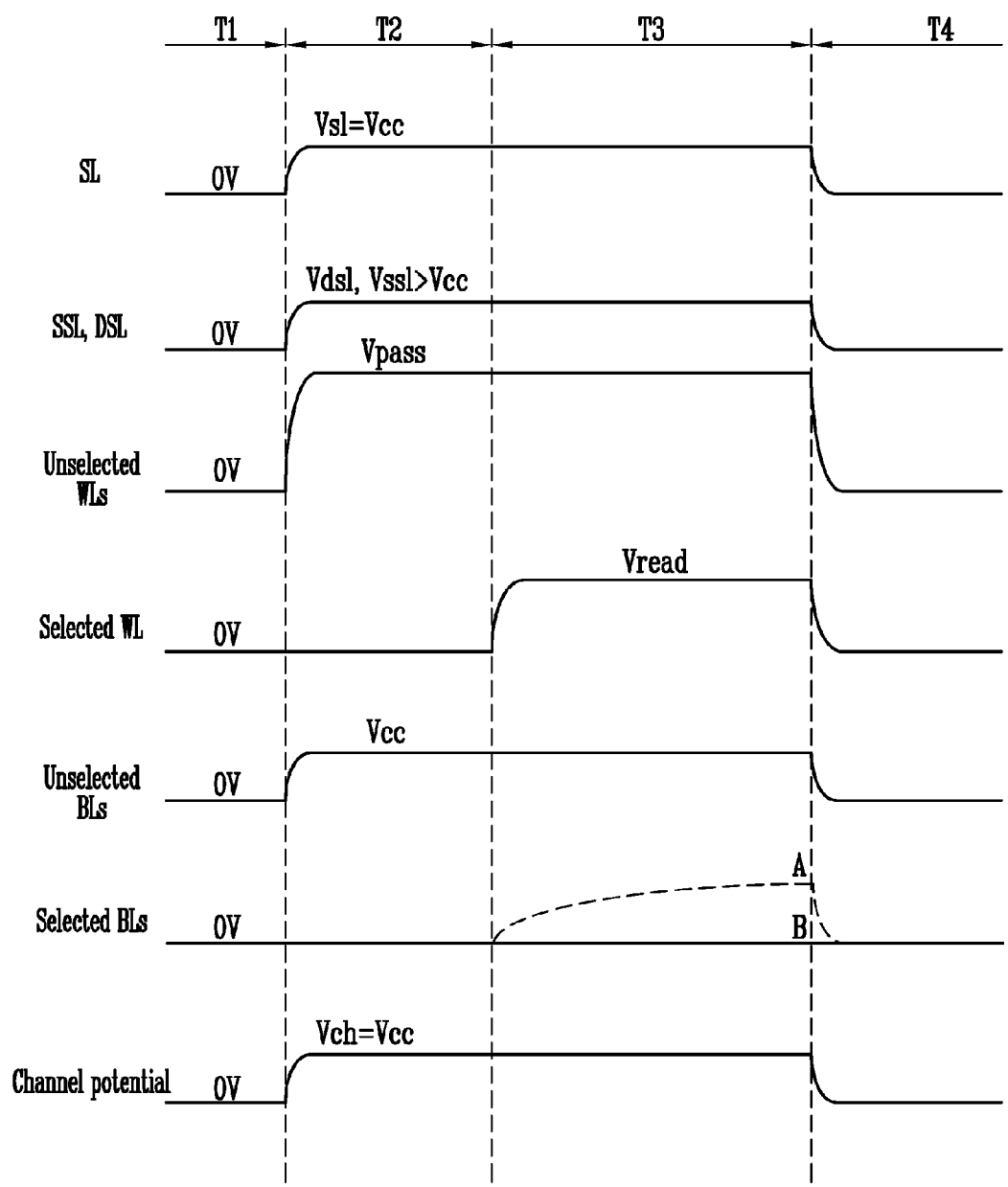
FIG. 4 and FIG. 5 illustrate waveform diagrams describing a method of operating a semiconductor memory device according to embodiments of the present invention.
Figure 5:
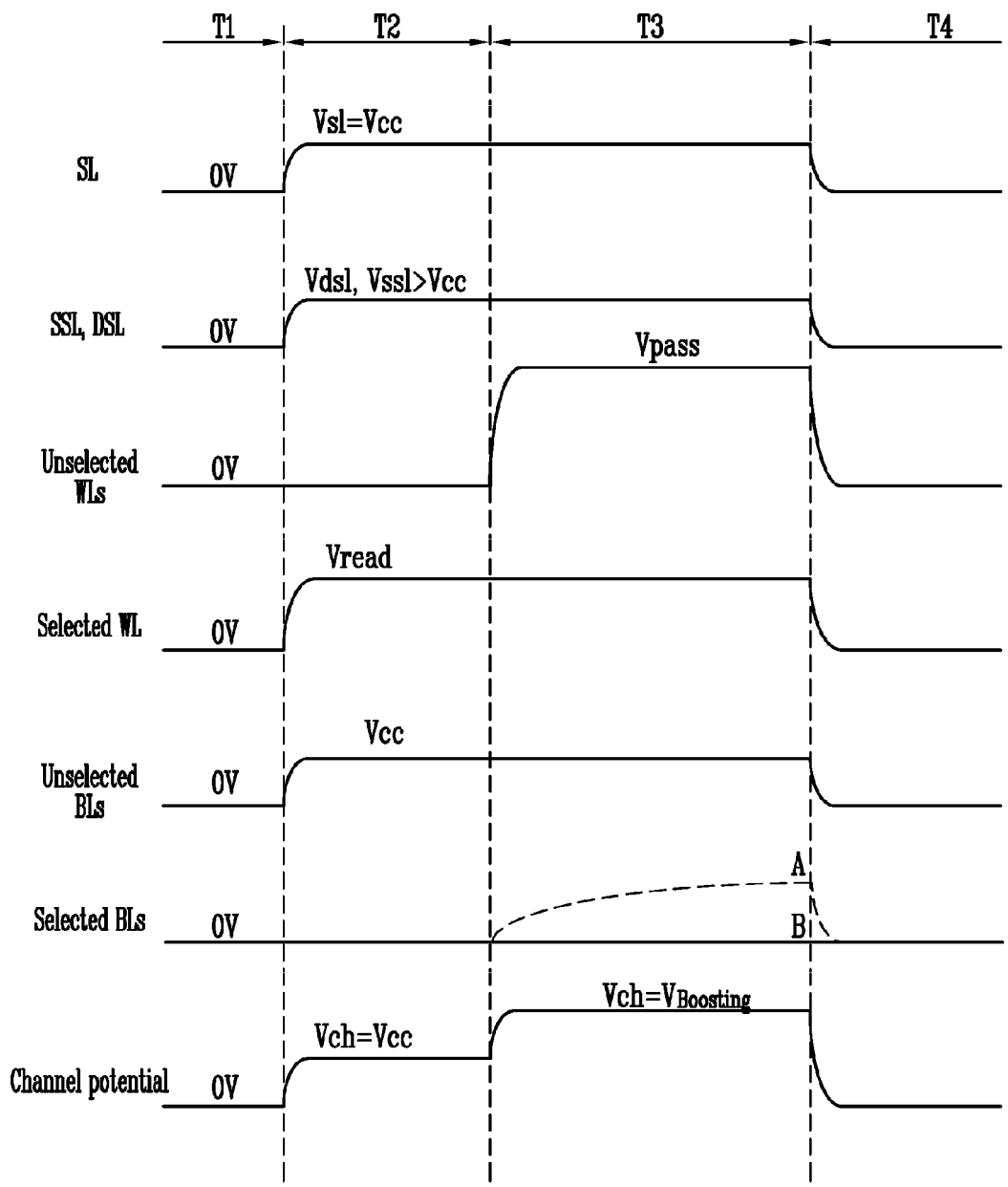

In a read operation of the even physical page according to another embodiment, the peripheral circuit 120~170 discharges the selected bit lines BLe0~BLek and precharges the unselected bit lines BL0~BLok. The peripheral circuit 120~170 supplies a positive voltage to the common source line SL. The unselected bit lines BL0~BLok and the common source line SL may be precharged to the same voltage, e.g., Vcc. As shown in FIG. 4, the peripheral circuit 120~170 may supply the select voltages Vssl and Vdsl to the select lines SSL and DSL, respectively, so that the select transistors SST and DST are turned on. It is desirable that the select voltages Vssl and Vdsl are supplied with a level equal to or higher than that of the voltage supplied to the unselected bit lines BL0~BLok or the common source line SL as shown in FIG. 5, for example, by 0V to 0.3V. The peripheral circuit 120~170 supplies the read voltage Vread to the selected word line, and supplies the pass voltage Vpass to the unselected word lines. It is desirable that the pass voltage Vpass is supplied with a level for turning on every memory cell irrespective of a program level of the memory cells and has a voltage level lower than that of the pass voltage Vpass in the program operation. Subsequently, the peripheral circuit 120~170 senses a voltage change or current change in the selected bit lines BLe0~BLek, and latches data stored in the selected memory cells according to the sensing result.

Referring again to FIG. 1, the peripheral circuit includes a control circuit 120 for controlling the program loop, the erase loop, and the read operation, and operation circuits 134, 150, 160, and 170 for performing the program loop, the erase loop, and the read operation. The operation circuits 134 to 170 supply operation voltages for the program loop, the erase loop, and the read operation to local lines SSL, WL0~WLn, and DSL of a selected memory block, and control precharging/discharging of bit lines or sense voltage or current of the bit lines. In the NAND flash memory device, the operation circuits may include a voltage supply circuit 134, a page buffer group 150, a column select circuit 160, and an input/output circuit 170. Hereinafter, these elements will be described in detail.

The control circuit 120 outputs a voltage control signal V_CONTROLs in response to a command signal CMD inputted from an external device through the input/output circuit 170, so that operation voltages Vpgm, Vread, Vpass, Vdsl, Vssl, Vsl, and Vtg for the program operation, the read operation, and the erase operation are generated with desired levels. The control circuit 120 outputs PB control signals PB_CONTROLs for controlling page buffers PB0~PBk in the page buffer group 150 to perform the program operation, the read operation, or the erase operation. The voltage control signal V_CONTROLs and the PB control signals PB_CONTROLs may be outputted from a program operation controller of the control circuit 120 when the program operation is performed, be outputted from a read operation controller of the control circuit 120 when the read operation is performed, and be outputted from an erase operation controller of the control circuit 120 when the erase operation is performed. That is, the program operation controller of the control circuit 120 may control the voltage supply circuit 134 and the page buffer group 150 in the program operation, the read operation controller of the control circuit 120 may control the voltage supply circuit 134 and the page buffer group 150 in the read operation, and the erase operation controller of the control circuit 120 may control the voltage supply circuit 134 and the page buffer group 150 in the erase operation.

An address controller of the control circuit 120 outputs a row address signal RADD to a row decoder 140 in the voltage supply circuit 134 and a column address CADD to the column select circuit 160 in response to an address signal ADD inputted from the external device through the input/output circuit 170.

The voltage supply circuit 134 outputs the operation voltages, e.g., Vtg, Vpgm, Vread, Vpass, Vdsl, Vssl, and Vsl, for the program loop, the read loop, or the erase operation of the memory cells to the local lines SSL, WL0~WLn, and DSL and the common source line SL of the selected memory block, in response to the voltage control signal V_CONTROLs provided from the control circuit 120. The voltage supply circuit 134 includes a voltage generation circuit 130 and the row decoder 140.

The voltage generation circuit 130 outputs the operation voltages, e.g., Vtg, Vpgm, Vread, Vpass, Vdsl, Vssl, and Vsl, for the program loop, the erase loop, or the read operation to global lines, in response to the voltage control circuit V_CONTROLs provided from the control circuit 120.

The row decoder 140 couples the global lines to the local lines DSL, WL0~WLn, and SSL so that the operation voltages outputted from the voltage generation circuit 130 to the global lines are delivered to the local lines DSL, WL0~WLn, and SSL and the common source line SL of a selected memory block, e.g., 110 MB, in the memory array 110, in response to the row address signal RADD provided from the control circuit 120.

The page buffer groups 150 include page buffers PB0~PBk coupled to the memory array 110 through the bit lines BLe0~BLek and BL0~BLok. The page buffers PB0~PBk of the page buffer group 150 selectively precharge the bit lines BLe0~BLek or BL0~BLok in the program loop or the read operation, in response to the PB control signals PB_CONTROLs provided from the control circuit 120, senses voltage change or current change in the precharged bit lines BLe0~BLek or BL0~BLok, and latches data depending on the sensing result.

The column select circuit 160 selects the page buffers PB0~PBk in the page buffer group 150 in response to the column address CADD outputted from the control circuit 120. That is, the column select circuit 160 delivers in sequence data to be stored in the memory cells to the page buffers PB0~PBk in response to the column address CADD. Additionally, the column select circuit 160 selects in sequence the page buffers PB0~PBk in response to the column address CADD, so that data, which is read out of the memory cells and latched in the page buffers PB0~PBk according to the read operation, is outputted to the external device.

The input/output circuit 170 delivers data to the column select circuit 160 under the control of the control circuit 120, so that the data inputted from the external device is provided to the page buffer group 150 and stored in the memory cells in the program operation. The page buffers PB0~PBk store the inputted data in an internal latch circuit when the data delivered through the input/output circuit 170 is provided to the page buffers PB0~PBk as described above. In the read operation, the input/output circuit 170 outputs data delivered from the page buffers PB0~PBk of the page buffer group 150 through the column select circuit 160 to the external device.

Hereinafter, embodiments of a method of operating the semiconductor memory device will be described in detail.

Figure 3:
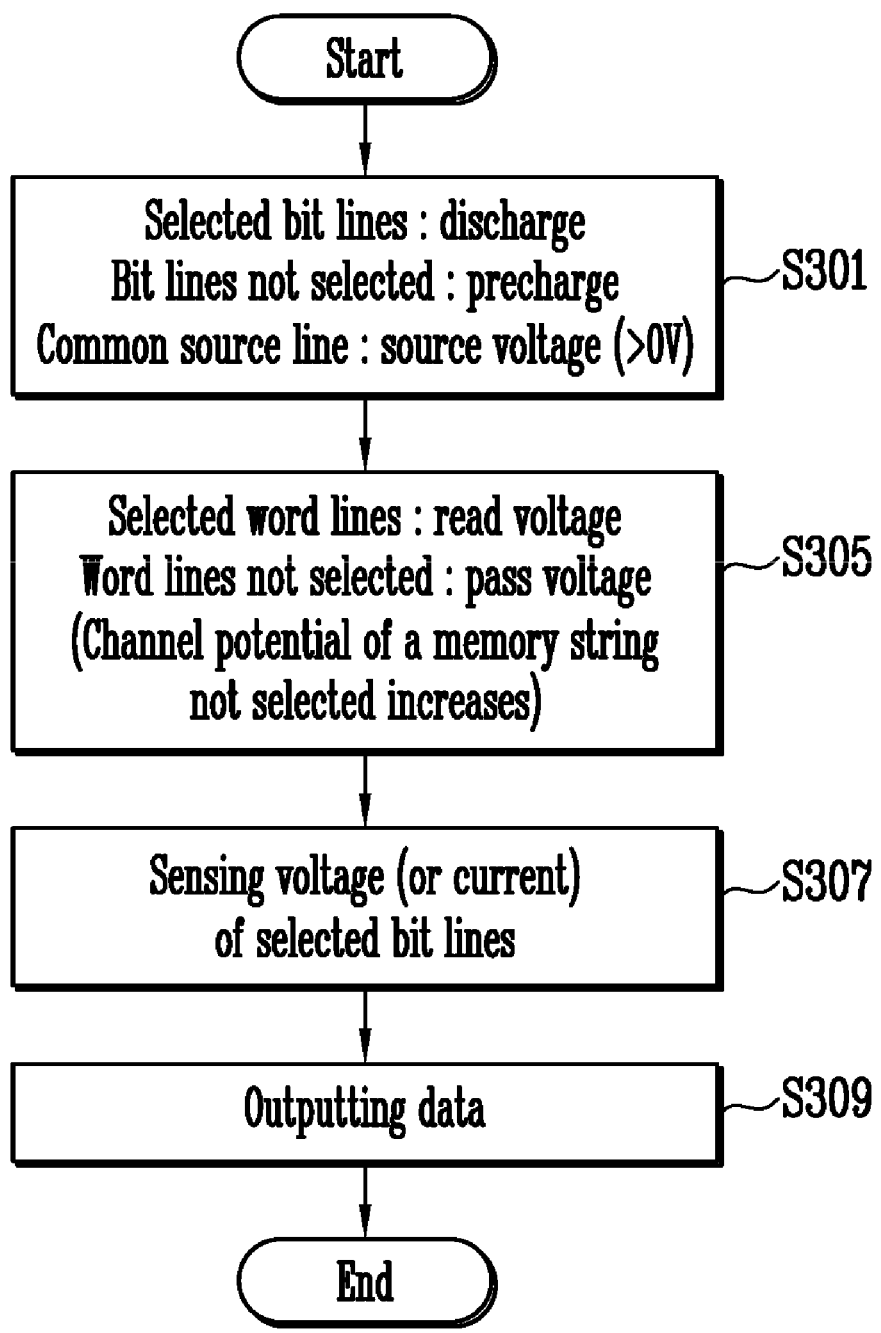
FIG. 3 is a flow chart illustrating a method of operating a semiconductor memory device according to an embodiment of the present invention.
Figure 6:
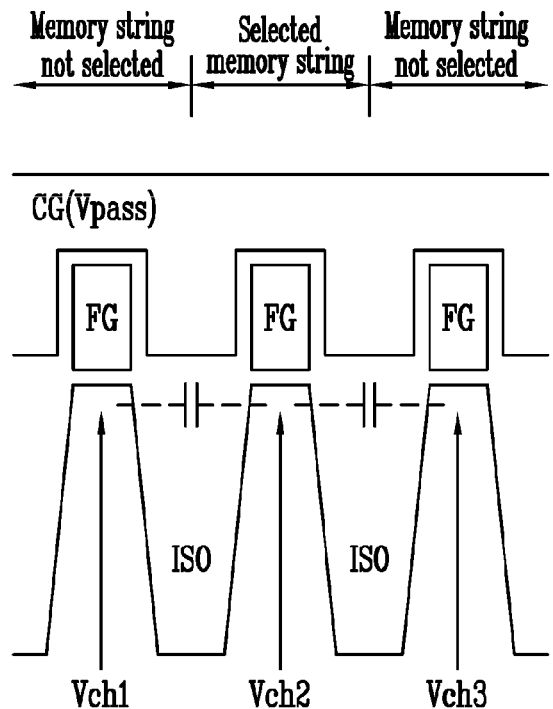
FIG. 6 is a view illustrating an increase of channel potential of an unselected memory string in a method of operating a semiconductor memory device according to an embodiment of the present invention.

FIG. 3 is a flow chart illustrating a method of operating a semiconductor memory device according to an embodiment of the present invention. FIG. 4 and FIG. 5 illustrate waveform diagrams describing a method of operating a semiconductor memory device according to embodiments of the present invention. FIG. 6 is a view illustrating an increase of channel potential of an unselected memory string in a method of operating a semiconductor memory device according to an embodiment of the present invention.

Referring to FIG. 1 to FIG. 4, each line and area maintains a discharge state, e.g., 0V, during an initial interval T1.

After that, if a read command signal and an address signal ADD are inputted thereto, the peripheral circuit 120~170 supplies a source voltage Vsl, e.g., Vcc, to the common source line SL coupled in common to the source select transistors SST of the memory strings ST and supplies a precharge voltage, e.g., Vcc, to unselected bit lines, e.g., the bit lines BL0~Blok, coupled respectively to the drain select transistors DST of the memory strings ST, in step S301, during a precharge interval T2. Selected bit lines, e.g., the bit lines BLe0~BLek, are discharged by the peripheral circuit 120~170. Here, the unselected bit lines represent bit lines coupled to memory strings including memory cells not selected in the read operation, and the selected bit lines represent bit lines coupled to memory strings including selected memory cells, i.e., memory cells to be read. The common source line SL and the unselected bit lines BL0~BLok may be simultaneously precharged.

In step S305, the peripheral circuit 120~170 supplies the pass voltage Vpass to unselected word lines and supplies the read voltage Vread to a selected word line, in response to the address signal ADD. The pass voltage Vpass may be supplied to the unselected word lines before the read voltage Vread is supplied to the selected word line. That is, the pass voltage Vpass may be supplied to the unselected word lines in the interval T2, and then the read voltage Vread may be supplied to the selected word line in a read interval T3. The pass voltage Vpass may be simultaneously supplied with the source voltage Vsl supplied to the common source line SL or the precharge voltage Vcc supplied to the unselected bit lines.

The selected bit lines maintain the discharge state before the read voltage Vread and the pass voltage Vpass are supplied. The read voltage Vread or the pass voltage Vpass is supplied under the condition that the precharge voltage Vcc is supplied to the unselected bit lines.

Referring to FIG. 6, a channel boosting phenomenon whereby channel voltages Vch1~Vch3 increase by capacitance coupling may occur in a channel area of memory strings as the pass voltage Vpass is supplied to the unselected word lines, i.e., control gates CG of unselected memory cells. In particular, bit lines of the unselected memory strings are precharged. If channel voltages Vch1 and Vch3 increase by the pass voltage Vpass, the drain select transistor DST is turned off by voltage relations of a drain, a gate and a source thereof, and channels of the unselected memory strings are in a floating state. Accordingly, the channel voltages Vch1 and Vch3 of the unselected memory strings increase by the capacitance coupling. However, since 0V is supplied to the bit line of the selected memory string, a channel voltage Vch2 of the selected memory string is discharged to the bit line. As a result, the channel voltage Vch2 of the selected memory string does not increase.

An isolation layer ISO is formed between a channel area of the selected memory string and a channel area of the unselected memory string, and thus parasitic capacitance is generated. As a result, channel potential of the unselected memory strings increases, and thus current flowing in the channel area of the selected memory string increases. Accordingly, current flowing from the common source line SL to the bit line increases, and sensing characteristics are enhanced. That is, the semiconductor memory device increases current flowing in the channel area of the selected memory string by increasing a level of the channel voltage of the unselected memory strings through the use of the channel boosting phenomenon, thereby enhancing the sensing characteristics.

Referring again to FIG. 1 to FIG. 4, a current path from the common source line SL to the selected bit line may be formed according to a program state (or a threshold voltage) of the selected memory cell when the read voltage Vread is supplied to the selected word line in the interval T3, under the condition that the select transistors SST and DST of the selected memory string are turned on by the select voltages Vssl and Vdsl, respectively, and the unselected memory cells are turned on by the pass voltage Vpass supplied to the unselected word lines. In other words, if the threshold voltage of the selected memory cell is higher than the read voltage Vread, the selected memory cell is turned off, and thus the current path from the common source line SL to the selected bit line is not formed. Accordingly, a voltage B (or current) of the selected bit line is not changed. On the other hand, if the threshold voltage of the selected memory cell is lower than the read voltage Vread, the selected memory cell is turned on, and thus the current path from the common source line SL to the selected bit line is formed. As a result, a voltage A (or current) of the selected bit line increases.

The page buffer group 150 senses a voltage (or current) change in the selected bit line, and latches data corresponding to the sensing result in step S307. Subsequently, in an interval T4, every line is discharged to a ground voltage, i.e., 0V, and the latched data is outputted to an external device in step S309.

Referring to FIG. 5, the read voltage Vread may be supplied to the selected word line before the pass voltage Vpass is supplied to the unselected word lines. The read voltage Vread may be supplied to the selected word line simultaneously with the source voltage Vsl supplied to the common source line SL or the precharge voltage Vcc supplied to the unselected bit lines. In this case, the channel voltage Vch of the unselected memory strings may increase twice, i.e., when the read voltage Vread is supplied to the selected word line and when the pass voltage Vpass is supplied to the unselected word lines, as shown in FIG. 5.

Figure 7:
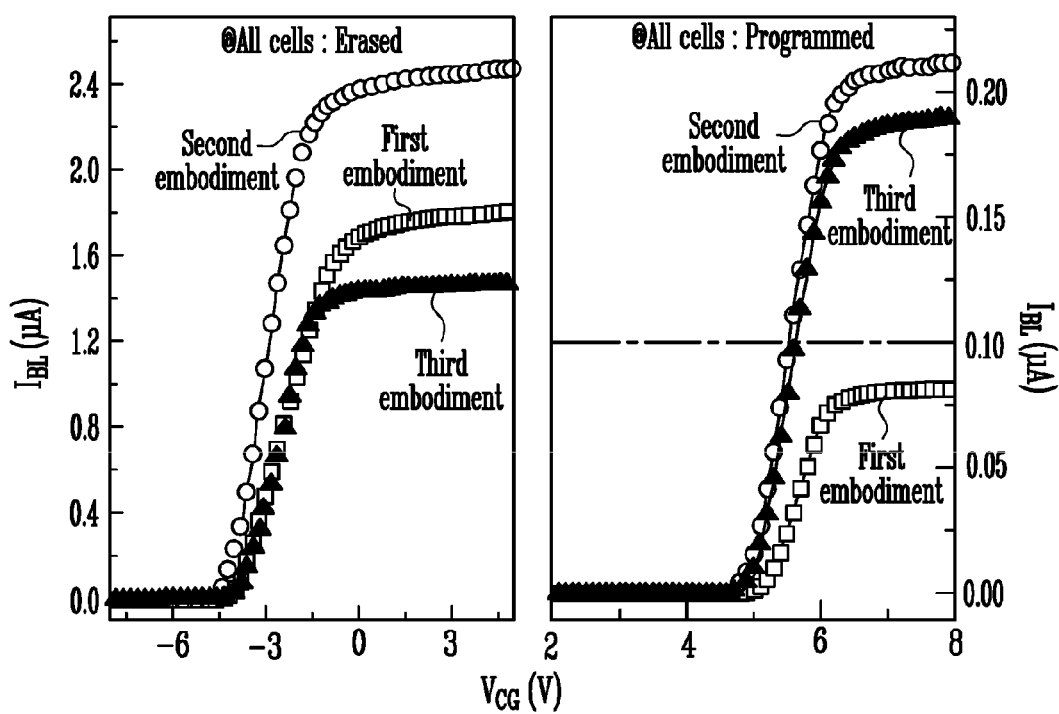
FIG. 7 illustrates graphs showing current differences according to an erase state and a program state of memory cells and operation methods thereof.

FIG. 7 illustrates graphs showing current differences according to an erase state and a program state of memory cells and operation methods thereof.

As shown in a left-side graph of FIG. 7, in the event that every memory cell is in the erase state, current flowing from the common source line SL to the bit line through the channel area of the memory string increases when a voltage Vcg supplied to a control gate of the memory cell is higher than −3V. In a second embodiment, as shown in FIG. 4, when the read operation is performed, current is greater than that when the read operation is performed in a first embodiment in which the channel potential of the unselected memory string does not increase. In a third embodiment, as shown in FIG. 5, when the read operation is performed, current is less than that when the read operation is performed in the first embodiment. However the difference between the current in the third embodiment and the current in the first embodiment is not great.

As shown in a right-side graph of FIG. 7, in the event that every memory cell is in the program state, when the read operation in the second and third embodiments shown in FIG. 4 and FIG. 5 is performed, current that flows from the common source line SL to the bit line through the channel area of the memory string is higher than current that flows when the read operation in the first embodiment is performed.

Thus, current flowing in the selected memory string in the read operation increases by increasing a level of the channel potential of the unselected memory strings, thereby enhancing the sensing characteristics.

Figure 8:
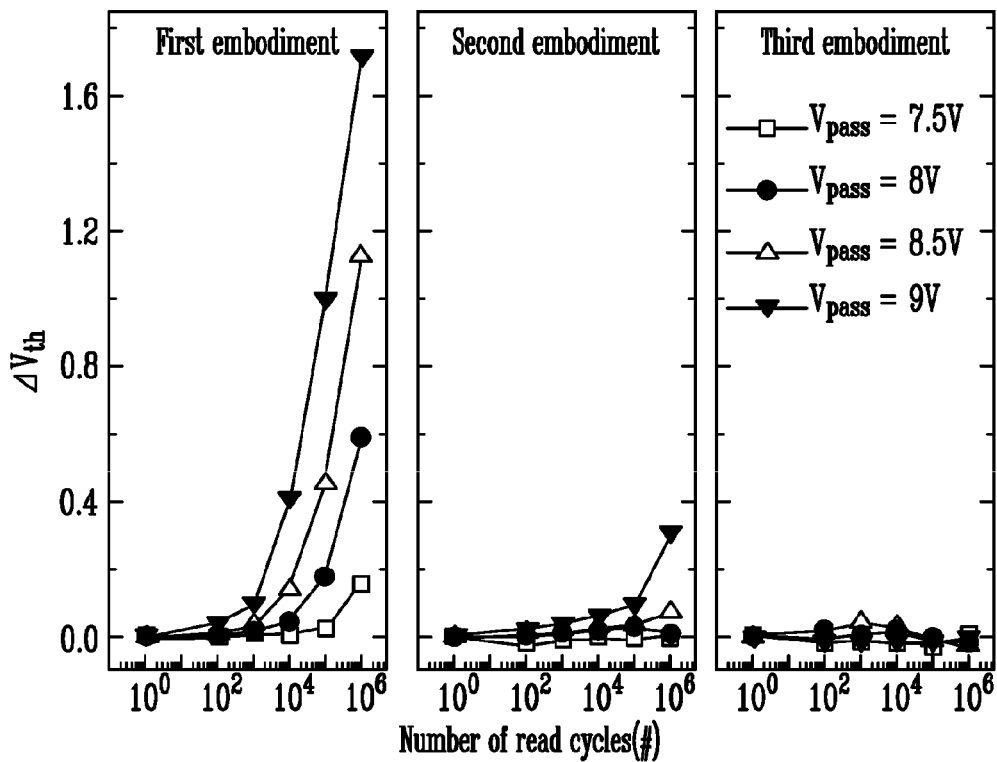
FIG. 8 illustrates graphs showing changes of a threshold voltage generated by read disturb as the number of read operations performed increases.

FIG. 8 illustrates graphs showing changes of a threshold voltage generated by read disturb according as the number of read operations performed increases.

As shown in FIG. 8, in accordance with the first embodiment where the channel potential of the unselected memory string does not increase, the threshold voltage of the memory cell substantially changes due to the read disturb according as the number of the read operations performed increases. However, in accordance with the second or third embodiment, the change of the threshold voltage of the memory cell due to the read disturb is small even though the number of the read operations performed increases. Accordingly, the deterioration of operational characteristics of the semiconductor memory device due to the read disturb may be reduced.

Figure 9:
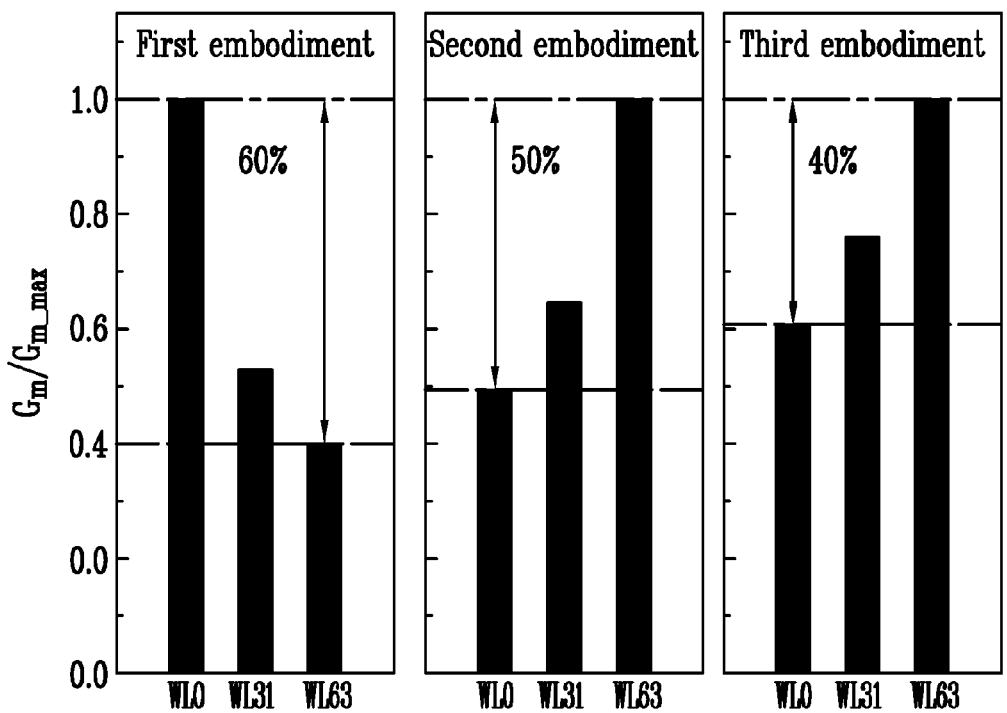
FIG. 9 illustrates graphs showing characteristic differences according to a location of a memory cell in a selected memory string.

FIG. 9 illustrates graphs showing characteristic differences according to a location of a memory cell in a selected memory string.

As shown in FIG. 9, a characteristic difference between memory cells of a first word line WL1 adjacent to a source select line SSL and memory cells of a word line WL63 adjacent to a drain select line DSL is 60% when the read operation in the first embodiment is performed. On the other hand, in accordance with the second and third embodiments, the characteristic difference reduces to 50% and 40%, respectively. Thus, more uniform operational characteristics may be realized.

Figure 10:
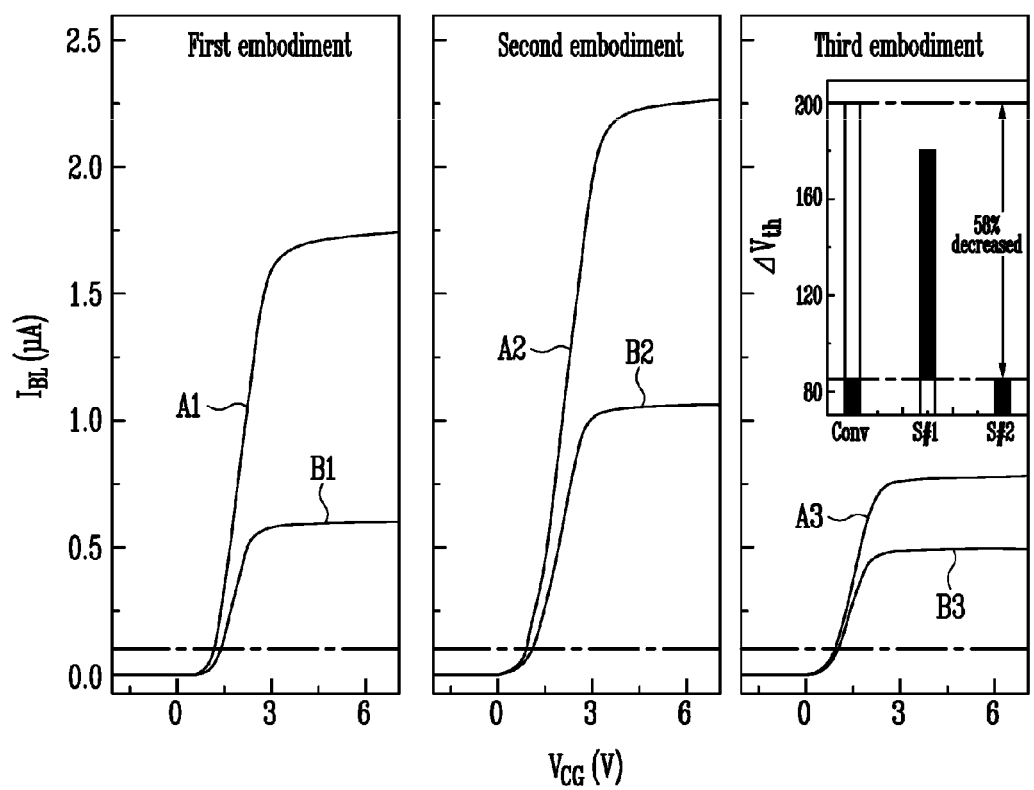
FIG. 10 illustrates graphs showing current differences according to a program state and an erase state of unselected memory cells.

FIG. 10 illustrates graphs showing current differences according to a program state and an erase state of unselected memory cells.

As shown in FIG. 10, a difference between current that flows from a common source line SL to a selected bit line through a channel area of a selected memory string when every unselected memory cell is in an erase state A1 and current when every unselected memory cell is in a program state B1 is great when the read operation in the first embodiment is performed on a first memory cell coupled to a source select transistor in the selected memory string.

Further, a difference between current when every unselected memory cell is in an erase state A2 and current when every unselected memory cell is in a program state B2, is also great when the read operation in the second embodiment shown in FIG. 4 is performed on the first memory cell coupled to the source select transistor in the selected memory string, but an amount of the current flowing from the common source line SL to the selected bit line through the channel area of the selected memory string increases. As a result, a change of the threshold voltage according to the state of the unselected memory cells is reduced compared to with a conventional technique.

Referring to FIG. 10, a difference between current when every unselected memory cell is in an erase state A3 and current when every unselected memory cell is in a program state B3, substantially reduces when the read operation in accordance with the third embodiment shown in FIG. 5 is performed on the first memory cell coupled to the source select transistor in the selected memory string. Accordingly, change of the threshold voltage according to the state of the unselected memory cells is considerably reduced compared to with the conventional technique.

In the event that the above read operation is performed, current flowing in the selected memory string increases, change of the threshold voltage due to the read disturb may be minimized even though the number of the read operations performed increases, and the deterioration of operational characteristics due to back pattern dependency may be reduced as shown in FIG. 10. As a result, operational characteristics and reliability of the semiconductor memory device may be enhanced.

Figure 11:
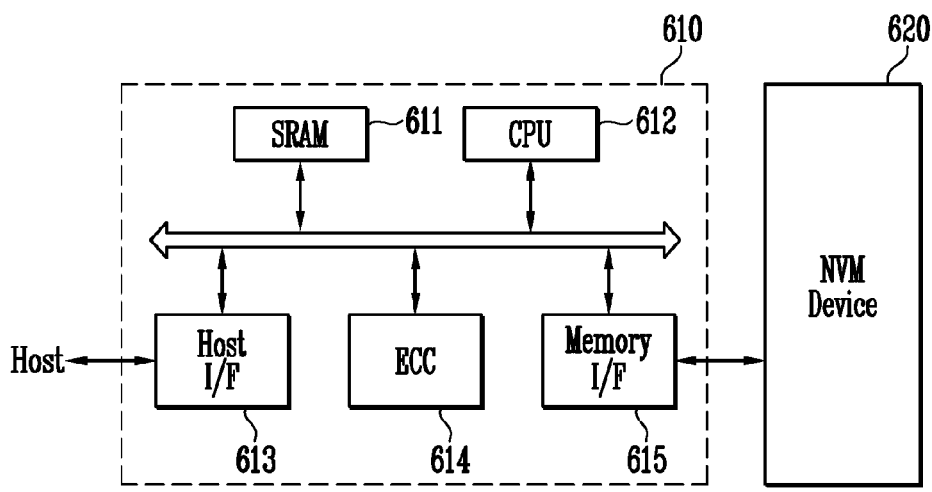
FIG. 11 illustrates a memory system according to an embodiment of the present invention.

FIG. 11 illustrates a block diagram of a memory system according to an embodiment of the present invention.

Referring to FIG. 11, the memory system 600 includes a non-volatile memory (NVM) device 620 and a memory controller 610.

The non-volatile memory device 620 may include the semiconductor memory device described above. The memory controller 610 controls the non-volatile memory device 620. The memory system 600 may be used as a memory card or a solid state disk (SSD) by combination of the non-volatile memory device 620 and the memory controller 610. An SRAM 611 is used as an operation memory of a processing unit 612, e.g., a CPU. A host interface 613 has a data exchange protocol of a host accessing the memory system 600. An error correction block 614 detects and corrects an error in data read out of the non-volatile memory device 620. A memory interface 615 interfaces with the non-volatile memory device 620. The processing unit 612 controls data exchange of the memory controller 610.

The memory system 600 may further include a ROM (not shown) for storing code data to interface with the host. The non-volatile memory device 620 may include a multi-chip package including flash memory chips. The memory system 600 may be provided as a highly-reliable storage medium having low error possibility. For example, the flash memory device of the present invention may be included in the SSD. In this case, the memory controller 610 communicates with an external device, e.g., a host, through one of various interface protocols such as USB, MMC, PCI-E, SATA, PATA, SCSI, ESDI, and IDE.

Figure 12:
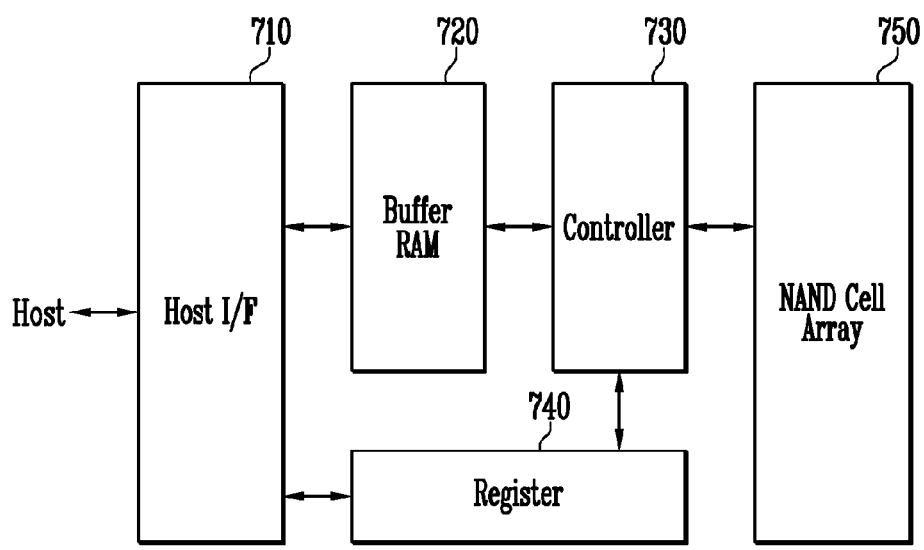
FIG. 12 illustrates a fusion memory device or a fusion memory system for performing a read operation according to an embodiment of the present invention.

FIG. 12 illustrates a block diagram of a fusion memory device or a fusion memory system for performing a read operation according to embodiments of the present invention. For example, features of embodiments of the present invention may be applied to a OneNAND flash memory device 700 as the fusion memory device.

The OneNAND flash memory device 700 includes a host interface 710 for exchanging information with a device using a different protocol, a buffer RAM 720 for embedding codes for driving a memory device or temporarily storing data, a controller 730 for controlling reading, programming, and erase states in response to a control signal and a command inputted from an external device, a register 740 for storing data such as command, address, and system operation environment in the memory device, and a NAND flash cell array 750 including non-volatile memory cells and a page buffer. The OneNAND flash memory device 700 programs data in accordance with embodiments of the present invention in response to a write request from the host.

Figure 13:
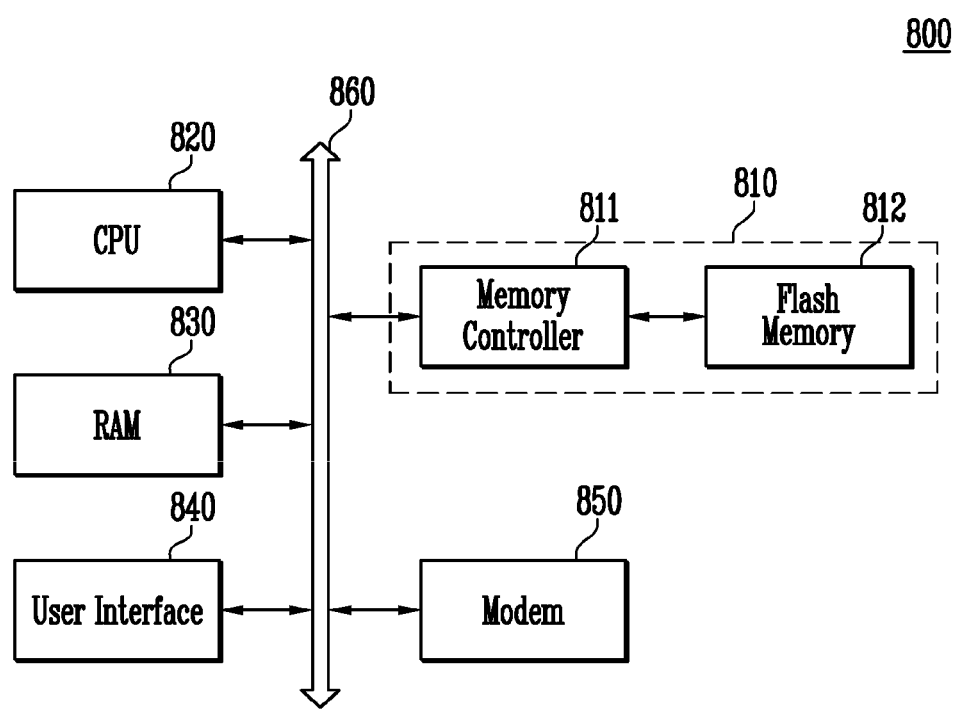
FIG. 13 illustrates a computing system including a flash memory device according to an embodiment of the present invention.

FIG. 13 illustrates a computing system including a flash memory device according to an embodiment of the present invention.

The computing system 800 includes a microprocessor 820, e.g., a CPU, electrically coupled to a system bus 860, a RAM 830, a user interface 840, a modem 850 such as a baseband chipset, and a memory system 810. In case that the computing system 800 is a mobile device, the computing system 800 may further include a battery (not shown) for supplying an operation voltage of the computing system 800. The computing system 800 may further include an application chipset, a camera image processor (CIS), a mobile DRAM, etc., (not shown). The memory system 810 may include an SSD using, for example, a non-volatile memory for storing data. The memory system 810 may be applied to a fusion flash memory, e.g., a OneNAND flash memory.

Although the present invention has been described with reference to a number of illustrative embodiments thereof, it should be understood that numerous other modifications and embodiments can be devised by those skilled in the art that will fall within the spirit and scope of the principles of this disclosure.

What is claimed is:

1. A method of operating a semiconductor memory device, the method comprising:
   supplying a positive source voltage to a source line coupled in common to source select transistors of memory strings, and supplying a precharge voltage to unselected bit lines of a plurality of bit lines respectively coupled to drain select transistors of the memory strings;
   supplying a pass voltage to unselected memory cells of a plurality of memory cells coupled to and disposed between the source select transistors and the drain select transistors;
   supplying a read voltage to selected memory cells of the plurality of memory cells; and
   sensing voltage or current of selected bit lines of the plurality of bit lines, which are coupled to the selected memory cells,
   wherein the positive source voltage is supplied to the source line so as to increase channel potential of memory strings coupled to the unselected bit lines while the pass voltage is supplied to the unselected memory cells and the read voltage is supplied to the selected memory cells.

2. The method of claim 1, further comprising:
   supplying a source select voltage to the source select transistors and a drain select voltage to the drain select transistors so that the source select transistors and the drain select transistors of selected memory strings are turned on when the positive source voltage and the precharge voltage are supplied to the source line and the unselected bit lines, respectively.

3. The method of claim 1, wherein the pass voltage is supplied before the read voltage is supplied.

4. The method of claim 1, wherein the pass voltage is supplied simultaneously with the positive source voltage or the precharge voltage.

5. The method of claim 1, wherein the read voltage is supplied before the pass voltage is supplied.

6. The method of claim 1, wherein the read voltage is supplied simultaneously with the positive source voltage or the precharge voltage.

7. The method of claim 1, wherein the channel potential of memory strings coupled to the unselected bit lines increases when a channel boosting phenomenon occurs when the pass voltage is supplied to the unselected memory cells.

8. The method of claim 1, wherein the selected bit lines maintain a discharge state before the read voltage and the pass voltage are supplied to the selected memory cells and the unselected memory cells, respectively.

9. The method of claim 1, wherein the read voltage or the pass voltage is supplied when the precharge voltage is supplied to the unselected bit lines.

10. A semiconductor memory device comprising:
a memory block including a plurality of memory strings coupled to and disposed between a plurality of bit lines and a common source line; and
a peripheral circuit configured to perform a read operation of memory cells included in selected memory strings of the plurality of memory strings, and increase channel potential of unselected memory strings of the plurality of memory strings in the read operation,
wherein the peripheral circuit is configured to supply a positive source voltage to the common source line so as to increase the channel potential of the unselected memory strings while a pass voltage is supplied to unselected memory cells and a read voltage is supplied to selected memory cells.

11. The semiconductor memory device of claim 10, wherein the peripheral circuit is configured to supply the positive source voltage to the common source line and supply a precharge voltage to unselected bit lines coupled to the unselected memory strings in the read operation.

12. The semiconductor memory device of claim 11, wherein the peripheral circuit is configured to discharge selected bit lines coupled to the selected memory strings when the precharge voltage is supplied to the unselected bit lines.

13. The semiconductor memory device of claim 10, wherein in the read operation, the peripheral circuit is configured to supply the pass voltage to the unselected memory cells of the memory cells and supply the read voltage to the selected memory cells of the memory cells when a precharge voltage is supplied to unselected bit lines coupled to the unselected memory strings.

14. The semiconductor memory device of claim 13, wherein the peripheral circuit is configured to supply the pass voltage to the unselected memory cells after the read voltage is supplied to the selected memory cells.

15. The semiconductor memory device of claim 13, wherein the peripheral circuit is configured to supply the read voltage to the selected memory cells after the pass voltage is supplied to the unselected memory cells.

16. A system comprising:
a semiconductor memory device; and
a controller configured to control the semiconductor memory device,
wherein the semiconductor memory device comprises:
a memory block including a plurality of memory strings coupled to and disposed between a plurality of bit lines and a common source line; and
a peripheral circuit configured to perform a read operation of memory cells included in selected memory strings of the plurality of memory strings, and increase channel potential of unselected memory strings of the plurality of memory strings in the read operation, and
wherein the peripheral circuit is configured to supply a positive source voltage to the common source line so as to increase the channel potential of the unselected memory strings while a pass voltage is supplied to unselected memory cells and a read voltage is supplied to selected memory cells.

17. The system of claim 16, wherein the peripheral circuit is configured to supply the positive source voltage to the common source line, supply a precharge voltage to unselected bit lines coupled to the unselected memory strings in the read operation, and discharge selected bit lines coupled to the selected memory strings when the precharge voltage is supplied to the unselected bit lines.

18. The system of claim 16, wherein in the read operation, the peripheral circuit is configured to supply the pass voltage to the unselected memory cells of the memory cells and supply the read voltage to the selected memory cells of the memory cells when a precharge voltage is supplied to unselected bit lines coupled to the unselected memory strings.

19. The system of claim 18, wherein the peripheral circuit is configured to supply the pass voltage to the unselected memory cells after the read voltage is supplied to the selected memory cells.

20. The system of claim 18, wherein the peripheral circuit is configured to supply the read voltage to the selected memory cells after the pass voltage is supplied to the unselected memory cells.

* * * * *